United States Patent [19]
Gill, Jr.

[11] Patent Number: 5,144,711
[45] Date of Patent: Sep. 8, 1992

[54] CLEANING BRUSH FOR SEMICONDUCTOR WAFER

[75] Inventor: Gerald L. Gill, Jr., Phoenix, Ariz.

[73] Assignee: Westech Systems, Inc., Phoenix, Ariz.

[21] Appl. No.: 674,594

[22] Filed: Mar. 25, 1991

[51] Int. Cl.$^5$ .............................................. B08B 11/02
[52] U.S. Cl. ...................................... 15/97.1; 15/21.1; 15/77; 15/88.2
[58] Field of Search ................ 15/21.1, 77, 88.1, 88.2, 15/97.1, 308, 310; 134/6

[56] References Cited

U.S. PATENT DOCUMENTS

| | | | |
|---|---|---|---|
| 2,530,530 | 11/1950 | Littlefield | 15/230.16 |
| 3,150,401 | 9/1964 | Taylor et al. | 15/21.1 X |
| 4,486,911 | 12/1984 | Beke | 15/21.1 |
| 4,566,911 | 1/1986 | Tomita et al. | 15/230.16 |
| 4,811,443 | 3/1989 | Nishizawa | 15/97.1 |
| 4,935,981 | 6/1990 | Ohtani et al. | 15/88.2 |

Primary Examiner—Edward L. Roberts
Attorney, Agent, or Firm—Tod R. Nissle

[57] ABSTRACT

Apparatus for cleaning an offset semiconductor wafer includes first and second opposed brushes circumscribing a common drive shaft. The wafer includes a circular peripheral edge. At any given instant, a first portion of the offset semiconductor wafer is positioned between and contacts the brushes while the second remaining portion of the semiconductor wafer extends outwardly from between the brushes. The peripheral edge of the second portion of the wafer contacts and is turned by a rotating support member.

9 Claims, 4 Drawing Sheets

CLEANING BRUSH FOR SEMICONDUCTOR WAFER

This invention pertains to brushes for cleaning the surface of an object.

More particularly, the invention relates to a cleaning brush which facilitates the uniform cleaning of the surface of a semiconductor wafer by continuously covering about 45% of the surface area of the wafer and by utilizing the weight of the brush to adjust the pressure applied by brush against the wafer surfaces.

In a further respect, the invention relates to a cleaning brush which maintains a planar laminar flow of fluid adjacent the surface of a semiconductor wafer to promote the removal of particles and other by-products during cleaning of the wafer by the brush.

Brushes utilized to clean semiconductor wafers presently ordinarily have a cylindrical shape, as does the brush described in U.S. Pat. No. 4,566,911 to Tomita et al. Several disadvantages are associated with such prior art cylindrical brushes. First, the curved cylindrical outer surface of the brush only contacts a small portion, about 5%, of the surface of the circular semiconductor wafer which it is used to polish. Second, the structure of the brush does not efficiently promote the flow of fluid over the semiconductor wafer being polished in order to remove particulate and other foreign material from the surface of the semiconductor wafer and from the surface of the brush itself. Finally, as cylindrical prior art brushes wear, the brush is mechanically moved to a new position to adjust the pressure of the brush against the semiconductor wafer.

Accordingly, it would be highly desirable to provide an improved cleaning brush which covered and polished a large area of a semiconductor wafer or other material, which facilitated the flow of water adjacent the wafer to carry away particulate and other foreign matter from the surface of the wafer and of the brush, and which used the weight of the brush to automatically maintain a selected pressure against the semiconductor wafer.

Therefore, it is a principal object of the invention to provide an improved brush for cleaning glass, metal, and other materials.

A further object of the invention is to provide an improved brush which continuously cleans well in excess of 5% of the total surface area of a semiconductor wafer.

Another object of the invention is to provide an improved brush which utilizes the flow of a fluid under gravity and centrifugal force to disperse fluid in a plane adjacent and intermediate the surface of a semiconductor wafer.

Still a further object of the invention is to provide an improved cleaning brush which utilizes the weight of the brush to automatically maintain a selected pressure against a surface being cleaned by the brush.

These and other, further and more specific objects and advantages of the invention will be apparent to those skilled in the art from the following detailed description thereof, taken in conjunction with the drawings, in which.

Briefly, in accordance with my invention, I provide improved apparatus for cleaning the finely finished planar surface of a semiconductor wafer. The apparatus includes brush means including upstanding spaced apart resilient feet generally lying in a first plane; and, support means for positioning the resilient feet in contact with the planar surfaces of the semiconductor wafer and for rotating at least one of the wafer and the brush such that the brush cleans the surface of the wafer. The brush preferably is adjacent and covers at least 40% of the area of the surface of the semiconductor wafer. The feet exert a pressure against the surface of the semiconductor wafer. The pressure of the feet against the wafer is altered by adjusting the weight of the brush bearing against the surface.

Figure 1:
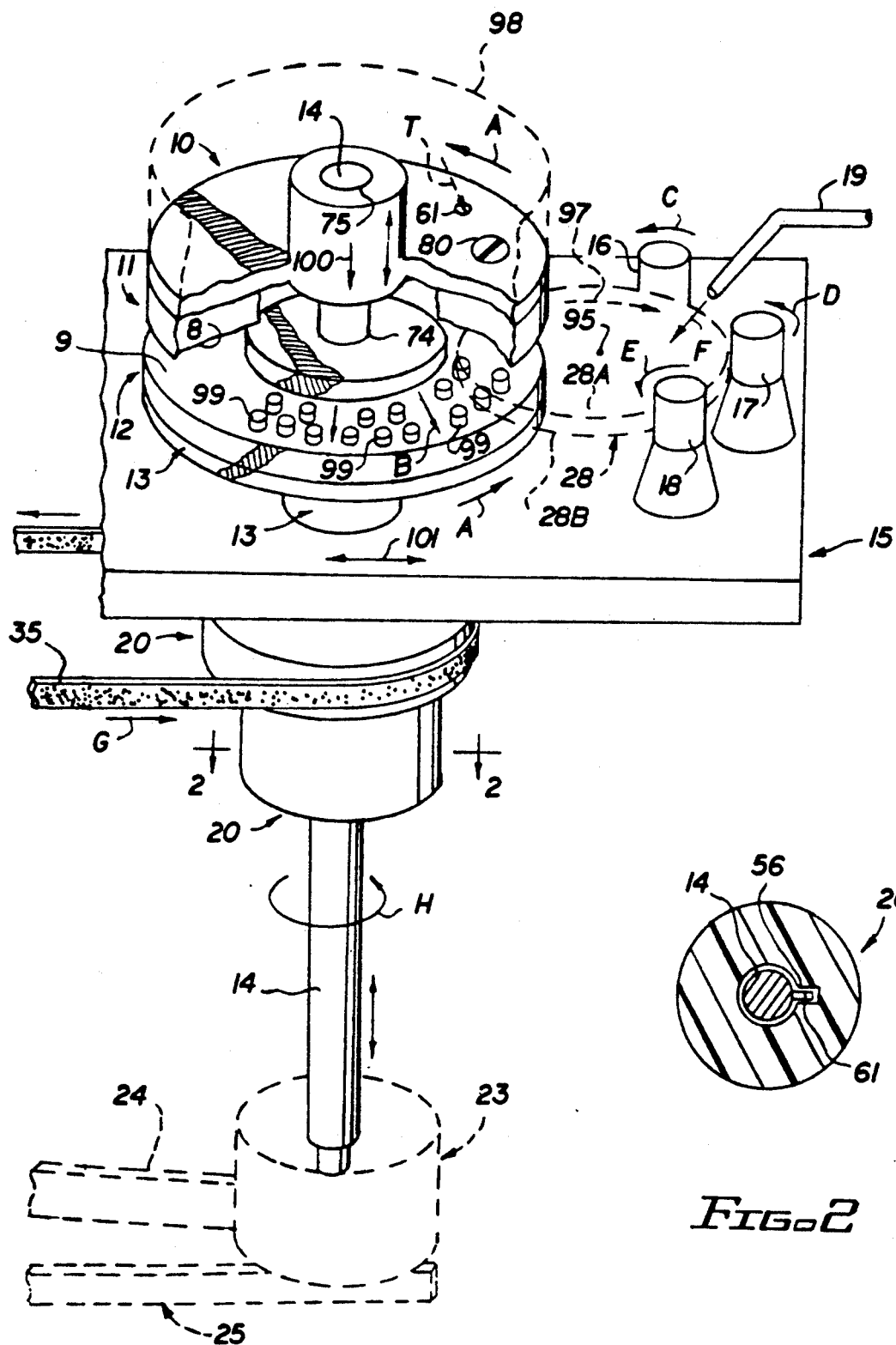
FIG. 1 is a perspective view illustrating a cleaning brush apparatus constructed in accordance with the principles of the invention.
Figure 2:
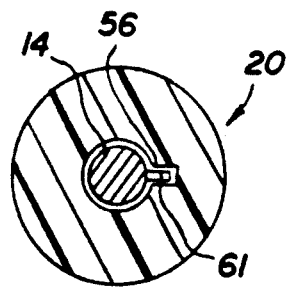
FIG. 2 is a section view illustrating a portion of the cleaning brush apparatus of FIG. 1 and taken along section line 2—2 thereof.
Figure 3:
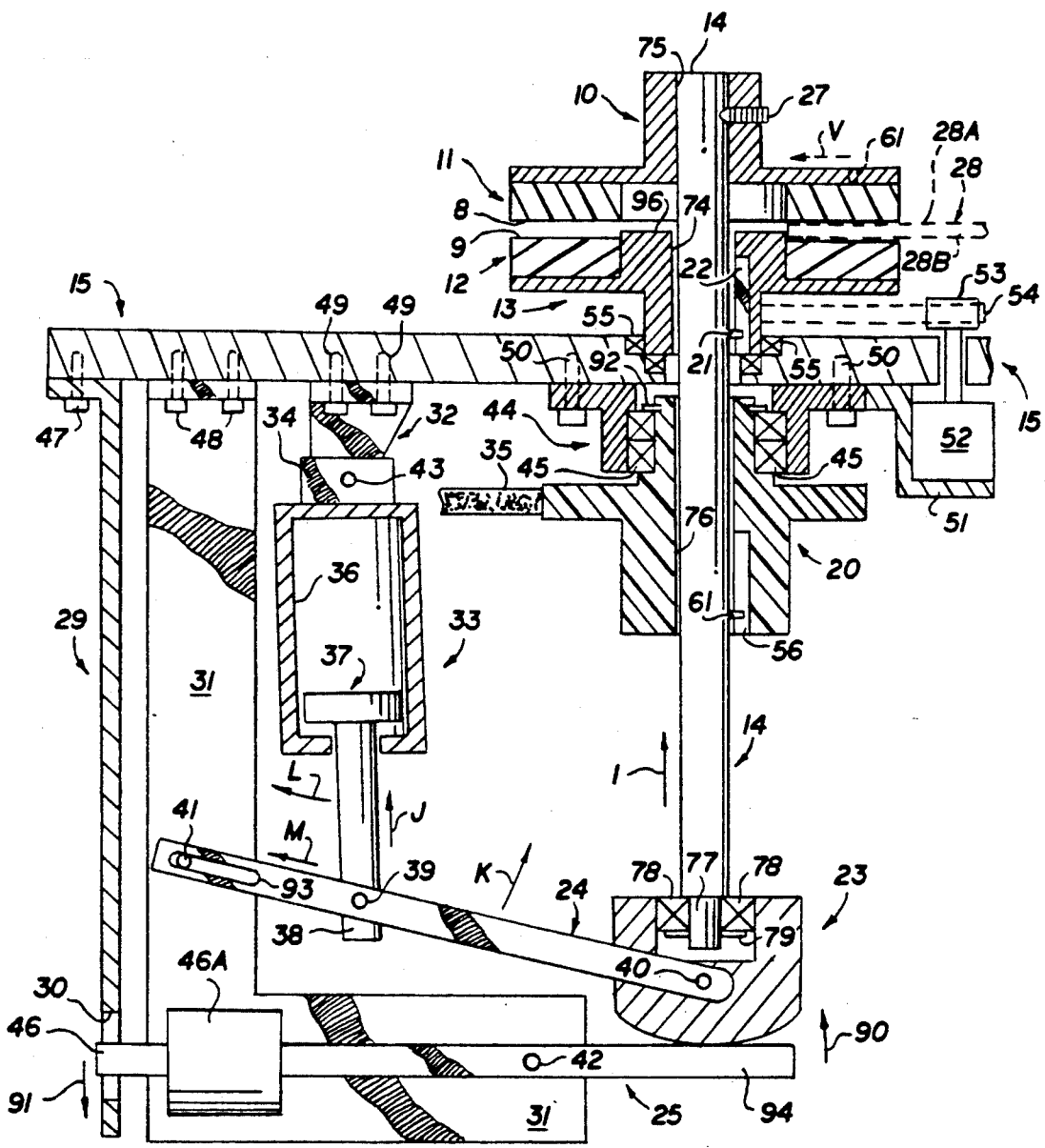
FIG. 3 is a side section view of the apparatus of FIG. 1 illustrating other construction components utilized to press the cleaning brush against a semiconductor wafer at a selected pressure.

Turning now to the drawings, which depict the presently preferred embodiments of the invention for the purpose of illustrating the practice thereof and not by way of limitation of the scope of the invention, and in which like reference characters refer to corresponding elements throughout the several views, FIGS. 1 to 3 illustrate a cleaning brush apparatus constructed in accordance with the principles of the invention and including a cylindrical plate 13 having a lower cylindrical neck rotatably received by bushings 55 in fixed table top 15. The legs or other supports utilized to maintain top 15 in fixed position are omitted from the drawings for the sake of clarity. Shaft 14 extends upwardly through cylindrical aperture 74 formed through plate 13 and is slidably received by cylindrical aperture 75 formed through plate 10. Set screw 27 secures shaft 14 in aperture 75. Shaft 14 also extends downwardly through cylindrical aperture 76 in cylindrical member 20. The lower cylindrical end 77 of shaft 14 is rotatably secured by bushing 78 in rocker 23. Bushing 78 is fixedly secured in rocker 23. Cotter pin 79 extends through the lower end 77 of shaft 14 and prevents end 77 from being pulled upwardly out of rocker 23 and bushing 78. The upper end of cylindrical member 20 is mounted for rotation in bushings 45. Bushings 45 are fixedly secured in cylindrical member 44. Cotter pin 92 extends through the upper end of cylindrical member 20 and prevents the upper end of member 20 from sliding downwardly through bushings 45. Cylindrical member 44 is fixedly secured to table top 15 by bolts 50. Resilient cleaning pad 11 is secured to the underside of plate 10 by bolts 80 which extend through plate 10. Resilient cleaning pad 12 is secured to the upper side of plate 13 by bolts 80 (not visible in the drawings) which pass through plate 13.

Elongate slot 22 is formed in plate 13 and receives pin 21 which extends outwardly from shaft 14. When shaft 14 rotates, pin 21 bears against slot 22 and rotates plate 13. Belt 35 is driven by a motor (not shown) and extends around member 20. When continuous belt 35 moves, it rotates member 20. When member 20 rotates, elongate slot 56 bears against cotter pin 61 and causes shaft 14 to rotate simultaneously with member 20. When shaft 14 rotates, pin 21 bears against elongate slot 22 and causes plate 13 to rotate simultaneously with shaft 14. The shape and dimension of slot 56 is identical to that of slot 22. If desired, pin 21 can be removed from shaft 14 and a separate motor 52 used to drive a pulley 53 and pulley belt 54 which extends around pulley 53 and plate 13. When pulley 53 rotates, it drives belt 54 and rotates plate 13. Utilizing motor 52 enables plate 13 to be rotated at different speeds than plate 10. Motor 52 also enables plate 13 to be rotated in a direction opposite plate 10.

L-shaped rigid panel member 31 is fixedly secured to table top 15 by screws 48. Pin 41 is fixedly attached to member 31 and slidably engages slot 93 in rod 24. Rod 24 is pivotally attached to arm 38 of piston 37 by pin 39. Pin 40 pivotally attaches one end of rod 24 to rocker 23. Pin 42 pivotally secures rod 25 to rigid L-shaped member 31 One end 94 of rod 25 bears upwardly against rocker 23. The other end 46 of rod 25 carries counterweight 46A. End 46 extends through slot 30 formed through rigid elongate panel member 29. Bolts 47 fixedly secure panel member 29 to table top 15. The plunger of piston 37 is housed in hollow pneumatic cylinder 33. Flange 34 of cylinder 33 is pivotally attached to flange 32 by pin 43. Flange 32 is fixedly secured to table top 15 by screws 49.

A circular wafer 28 fabricated from semiconductor material, metal or other material is positioned intermediate cleaning pads 11 and 12 in the manner illustrated in FIGS. 1 and 3; provided, however, it is preferred that plates 10, 13 and pads 11, 12 be sized such that the diameter of pads 11 and 12 is sufficient for the pads to extend over a portion of the peripheral edge of wafer 28 and over the centerpoint 95 of wafer 28. In FIG. 1, the outer peripheral edge of pad 11 does not extend over the centerpoint 95 of water 28 but instead only extends part way to centerpoint 95. Pads 11 and 12 would extend outwardly over the centerpoint 95 of wafer 28 if the diameters of circular plates 10, 13 and pads 11, 12 were appropriately increased. When pads 11 extend outwardly over the centerpoint 95 of wafer 28, then pads 11, 12 cover about 45% of the combined upper and lower circular planar surface areas of wafer 28. Pads 11, 12 preferably cover at least 40% of the planar surface areas of wafer 28.

The outer peripheral edge of wafer 28 preferably abuts against collar 96 of plate 13 in the manner illustrated in FIG. 3. Heads 16, 17, 18 engage the circular peripheral edge of wafer 28 such that when heads 16 to 18 rotate in the directions indicated by arrows C, D, E, respectively, heads 16 to 18 function to assist in the rotation of wafer 28. When polishing pads 11 and 12 rotate in the direction of arrow A, pads 11 and 12, along with collar 96, also assist in rotating wafer 28 in the direction of arrow 97 in FIG. 1.

In operation of the apparatus of FIGS. 1 and 3, pneumatic cylinder 33 is operated to cause piston 37 to move in the direction of arrow J to raise rod 24 in the direction of arrow K. As rod 24 is displaced in the direction of arrow K it pivots about pin 39 and also moves in the direction of arrow M. As rod 24 moves in the direction of arrow M, slot 93 slides over point 41 and flange 34 and cylinder 33 pivot about pin 43 in the direction of arrow L. Further, as rod 24 is displaced in the direction of arrow K, shaft 14 is moved in the direction of arrow I, raising plate 10 and pad 11 upwardly away from pad 12 such that a wafer 28 can be inserted on top of pad 12 in the position generally indicated in FIGS. 1 and 3. Once wafer 28 is placed on pad 12, piston 37 is pneumatically moved in a direction opposite that of arrow J such that piston 37, rod 24, rocker 23, shaft 14, pad 11 and plate 10 return to the position shown in FIGS. 1 and 3.

Once wafer 28 is inserted between pads 11, 12 in the position generally indicated in FIGS. 1 and 3, a motor is operated to turn continuous belt 35 in the direction of arrow G and, consequently, to turn shaft 14 in the direction of arrow H to cause pads 11, 12 to rotate in the direction of arrow A over the upper 28A and lower 28B planar surfaces of wafer 28. Auxiliary motors (not shown) drive heads 16 to 18 in the directions indicated by arrows C, D, E in FIG. 1.

While plates 10 and 13 rotate, water from a reservoir 98 on top of plate 10 travels in the direction of arrow T through at least one aperture 61 formed through plate 10. The water travels downwardly through aperture 61 and along a groove (not shown) formed on the underside of plate 10 adjacent cleaning pad 11. The water flows through the groove toward shaft 14 in the direction of arrow V in FIG. 3. After the water emerges from between the undersurface of plate 10 and pad 11, it travels under centrifugal force outwardly between nipples or feet 99 in the direction indicated by arrows B in FIG. 1. Nipples 99 are preferably formed in the manner shown in FIG. 1, in cluster or fields with open spaces between the fields which facilitate the outward laminar flow of water or other fluids or slurries in the direction indicated by arrows B in FIG. 1. In FIG. 1, water traveling in the directions and along paths indicated by arrows B is moving through open spaces or channels between adjacent clusters of five nipples 99. In FIG. 1 only some of the nipples or feet clusters on pads 11 and 12 are shown. Nipples or feet 99 preferably comprise spaced apart clusters formed on the entire surface of pads 11 and 12. Water is also directed onto the upper surface 28A of wafer 28 in the direction of arrow F by conduit 19. A similar conduit can be utilized to direct water onto the lower surfaces 28B of wafer 28.

Counterweight 46A causes end 94 of rod 25 to bear upwardly against rocker 23 in the direction of arrow 90. The magnitude of the force generated in the direction of arrow 90 offsets some of the weight of shaft 14, plate 10 and pad 11 which bears downwardly against wafer 28. Consequently, moving counterweights 46A along rod 25 adjusts the magnitude of the compressive force generated against wafer 28 by pad 11. Similarly, moving piston 37 in cylinder 33 can also alter the magnitude of the compressive force generated on wafer 28 by pad 11. As would be appreciated by those of skill in the art, controls for determining the desired position of piston 37 in cylinder 33 and the position of counterweight 46A on rod 25 and for moving piston 37 and counterweight 46A can be computer controlled and used to automatically adjust the position of piston 37 and counterweight 46A. In particular, the weight of rocker 23, shaft 14, plate 10 and pad 11 bearing downwardly against rod 25 can be approximated or determined from data including the thickness of wafer 28, the compressibility of pads 11 and 12, and the vertical position of counterweight 46A. Counterweight 46A or piston 37 can then be adjusted to increase or reduce the magnitude of the force generated against wafer 28 by pad 11.

Figure 4:
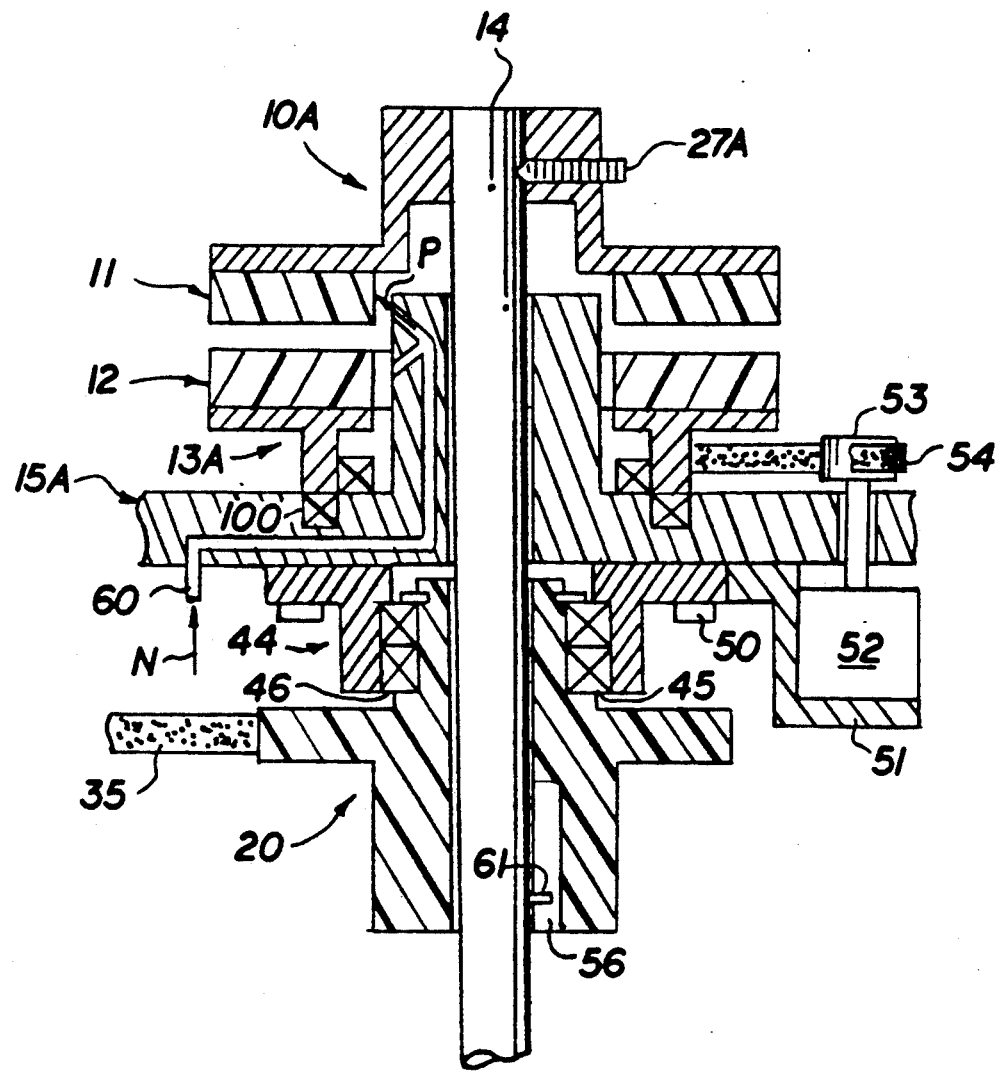
FIG. 4 is a side section view illustrating a cleaning brush apparatus constructed in accordance with an alternate embodiment of the invention; and, FIG. 5 is a side section view illustrating mold apparatus utilized to produce a circular, flat, nippled brush pad in accordance with the invention.

An alternate embodiment of the invention is illustrated in FIG. 4 and is similar in many respects to the apparatus illustrated in FIGS. 1 to 3. In FIG. 4, plate 10A is affixed to shaft 14 by set screw 27A and carries pad 11. Plate 13A rotates on bushing 100 and is rotated by continuous belt 54 carried on pulley 53 driven by motor 52. Water or another fluid or slurry is distributed on pads 11 and 12. Water travels through conduit 60 in the direction of arrow N and is distributed on pads 11 and 12 in the directions indicated by arrow P in FIG. 4. In FIG. 4, feet 99 of pads 11 and 12 are not shown. Continuous belt 35 turns member 20. When member 20 is rotated, member 20 simultaneously rotates shaft 14, plate 10A and pad 11. Continuous belt 53 rotates plate 13A and pad 12. If desired, the plate 10A plate—13A apparatus of FIG. 4 can be substituted in FIG. 1 for plates 10 and 13.

Figure 5:
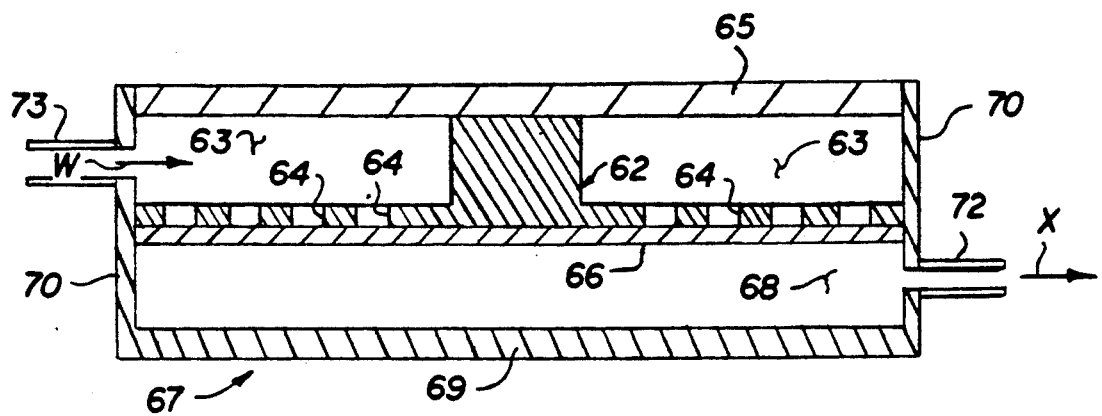

FIG. 5 illustrates a molding apparatus utilized to produce an elastic cleaning pad 11, 12. The mold apparatus includes top plate 65, mold member 62, porous teflon plate 66, and U-shaped housing 67. Housing 67 includes circular base 69 and upstanding cylindrical wall 70 depending from base 69. A vacuum pump (not shown) draws air out of chamber 68 through conduit 72 in the direction of arrow X. A polyvinyl acetal elastic material containing many small air bubbles is directed into cylindrical molding chamber 63 through conduit 73 in the direction of arrow W. The vacuum in chamber 68 draws air in the polyvinyl acetal material through teflon plate 66. If desired, circular plate 65 can be fabricated from porous teflon so that air can be drawn under vacuum from the polyvinyl acetal elastic material upwardly through plate 65. The feet 99 on pads 12 are formed when the polyvinyl acetal material flows into cylindrical openings 64 in member 62. After the polyvinyl acetal material has solidified, plate 65 is removed and the molded pad of polyvinyl acetal material is removed from the mold apparatus.

In use of the apparatus of FIGS. 1 to 4, it is important that pads 11 be flooded with water. The water acts as a lubricant and flushes foreign particles from the face of each brush. Feet 99 have a 0.2 inch diameter and preferably have a diameter in the range of 0.1 inch to 0.4 inch. The height of each foot 99 is preferably 0.15, to 0.2 inch. In FIG. 1, feet 99 can be elastically compressed in the direction indicated by arrow 100 and can be elastically laterally displaced in directions indicated by arrows 101. In each cluster of feet 99 illustrated in FIG. 1, the distance from one foot 99 to the closest adjacent foot is 0.25 inch, preferably 0.05 to 0.75 inch. The ability of each foot 99 to be elastically laterally displaced in the directions indicated by arrows 101 is minimal such that the flat circular surface tips of each foot 99 remain in contact with wafer 28 during utilization of the apparatus of FIGS. 1 to 4. The position of heads 16 to 18 on table top 15 is adjustable such that wafers 28 of differing diameters can be cleaning using the brush apparatus of the invention.

The upper plate 10 and pad 11 can be rotated at an RPM which is different than the RPM of the lower plate 13 and pad 12. Such a differential RPM for one plate 10 with respect to the other plate 12 may provide an important advantage in the scrubbing or cleaning or semiconductor wafer 28. Wafer 28 can have finely or partially finished upper 28A and lower 28B circular planar surfaces. Plates 10, 11 typically rotate at the same RPM.

While heads 16 to 18 are preferably driven, they can, if desired, free wheel and not be driven such that pads 11 and 12 cause wafer 28 to rotate.

The flat brushes 11, 12 of the invention function to minimize forces generated between the feet 99 and wafer 28 to minimize wear of the brush and wafer.

Feet 99 outwardly depend from circular planar surfaces 8 and 9 of pads 11 and 12. As earlier noted, at any given instant during operation of the apparatus of FIGS. 1 to 4 to clean a wafer 28, surfaces 8 and 9 and feet 99 together cover well in excess of 5% of the total area of surfaces 28A and 28B, i.e., surfaces 8 and 9 and feet 99 preferably cover at least 40% of the combined area of surfaces 28A and 28B.

Having described my invention in such terms as to enable those skilled in the art to understand and practise it, and having identified the presently preferred embodiments thereof, I claim:

1. Apparatus for cleaning a circular semiconductor wafer, said wafer having a peripheral edge and a centerpoint spaced apart from and circumscribed by said peripheral edge, said apparatus including:
   (a) a first brush attached to a shaft and including a base and upstanding spaced apart resilient members attached to said base and generally lying in a first plane;
   (b) a second brush circumscribing said shaft and having a base and upstanding spaced apart resilient members attached to said base of said second brush and generally lying in a second plane, said first and second planes facing one another and effective for accommodating at any given instant a portion of a semiconductor wafer to be cleaned therebetween, said resilient members in said first and second planes collectively circumscribing said shaft, said shaft extending from said first to said second brush and through said first and second planes, said brushes being shaped and dimensioned such that when said wafer is interposed between said brushes,
      (i) only a portion of said wafer lies intermediate said members in said first plane and said members in said second plane, and
      (ii) a portion of said wafer extends outwardly away from
         said members in said first plane,
         said members in said second plane, and
         said rotating shaft;
   (c) support means contacting said peripheral edge of said portion of said wafer extending outwardly away from
      (i) said members in said first plane
      (ii) said members in said second plane, and
      (iii) said rotating shaft; and
   (d) means for rotating at least one of said brushes to move said upstanding resilient members in said first plane over said wafer and promote the rotation of said wafer about said centerpoint of said wafer and over said first and second brushes such that a point on said peripheral edge of said rotating wafer continuously repeatedly
      (i) contacts said supporting means,
      (ii) disengages from said support means and moves between said members in said first and second planes, and
      (iii) moves out between said members in said first and second planes and back into contact with said support means.

2. The apparatus of claim 1 wherein said first and second brushes are shaped and dimensioned such that said members in said first plane pass over and clean an area of said wafer which extends at least from said centerpoint of said wafer to said peripheral edge of said wafer.

3. Apparatus for cleaning a circular semiconductor wafer, said wafer having a peripheral edge and a centerpoint spaced aparatus from and circumscribed by said peripheral edge, said apparatus including:
(a) a first brush attached to a shaft and including a base and upstanding spaced apart resilient members attached to said base and generally lying in a first plane;
(b) a second brush circumscribing said shaft and having a base and upstanding spaced apart resilient members attached to said base of said second brush and generally lying in a second plane, said first and second planes facing one another and effective for accommodating a portion of a semiconductor wafer to be cleaned therebetween, said resilient member in said first and second planes collectively circumscribing said shaft, said shaft extending from said first to said second brush and through said first and second planes, said brushes being shaped and dimensioned such that when said wafer is interposed between said brushes,
   (i) only a portion of said wafer and of said peripheral edge of said wafer lies intermediate said members in said first plane and said members in said second plane,
   (ii) a portion of said wafer and of said peripheral edge of said wafer extends outwardly away from said members in said first plane,
   said members in said second plane,
   said rotating shaft, and
   (iii) only a portion of said wafer and of said peripheral edge of said wafer lies intermediate said first and second brushes;
(c) means for rotating at least one of said brushes to move said upstanding resilient members in said first plane over said wafer to promote the rotation of said wafer about said centerpoint of said wafer;
(d) support means contacting said peripheral edge of said portion of said wafer extending outwardly away from
   (i) said members in said first plane,
   (ii) said members in said second plane, and
   (iii) said rotating shaft,
   said support means being operatively associated with said first and second brushes to maintaining said wafer rotating between said first and second brushes, between said shaft and said support means, and between said members in said first plane and said members in said second plane; and,
(e) means for displacing said shaft and said first brush between at least two operative positions with respect to said second brush,
   (i) a first operative position with said members in said first plane adjacent said members in said second plane to contact and clean said wafer interposed therebetween, and
   (ii) a second operative position with
   said first brush moved from said first operative position away from said second brush, and
   said shaft moved upwardly through said second brush.

4. The apparatus of claim 3 including counterbalance means operatively associated with said displacement means for altering the pressure of said first brush against said wafer interposed between said first and second brushes when said first brush is in said first operative position.

5. The apparatus of claim 4 wherein the force of gravity presses said first brush against said wafer to produce a compressive force acting on said wafer and said counterbalance means alters the magnitude of said compressive force by generating a force on said shaft and said first brush acting counter the force of gravity.

6. Apparatus for cleaning a circular semiconductor wafer, said wafer having a peripheral edge and a centerpoint spaced apart from and circumscribed by said peripheral edge, said apparatus including:
(a) a first brush including a centerpoint, a base and a plurality of upstanding spaced apart resilient members attached to said base and generally lying in a first plane;
(b) a second brush having a centerpoint, a base and a plurality of upstanding spaced apart resilient members attached to said base of said second brush and generally lying in a second plane, said first and second planes facing one another and effective for accommodating a portion of a semiconductor wafer to be cleaned therebetween, said resilient members in said first and second planes collectively circumscribing said shaft, said brushes being shaped and dimensioned such that when said wafer is interposed between said brushes,
   (i) a first portion of said wafer lies intermediate said first and second brushes, and
   (ii) a second portion of said wafer extends outwardly away from said first and second brushes;
(c) support means contacting said peripheral edge of said second portion of said wafer; and
(d) means for rotating at least one of said brushes about an axis passing through the centerpoint of said one of said brushes to move said upstanding resilient members of said one of said brushes over said wafer to promote the rotation of said wafer about said centerpoint of said wafer and over said first and second brushes such that a point on said peripheral edge of said rotating wafer continuously repeatedly .
   (i) contacts said support means,
   (ii) disengages from said support means and moves between said members in said first and second planes, and
   (iii) moves out from between said members in said first and second planes and back into contact with said support means, and such that said one of said brushes rotates over said centerpoint of said wafer at a greater speed than over the periphery of said wafer;
   said wafer being spaced apart from the axis.

7. The apparatus of claim 6 wherein said rotating means rotates said first and second brushes in the same direction at the same speed.

8. The apparatus of claim 6 wherein said rotating means rotates said first and second brushes in the same direction and rotates said first brush at a different speed than said second brush.

9. The apparatus of claim 6 wherein said rotating means rotates said first brush in a direction opposite that of said second brush.

* * * * *